United States Patent
Hung et al.

(10) Patent No.: US 9,607,944 B1
(45) Date of Patent: Mar. 28, 2017

(54) EFFICIENT LAYOUT PLACEMENT OF A DIODE

(71) Applicant: VANGUARD INTERNATIONAL SEMICONDUCTOR CORPORATION, Hsinchu (TW)

(72) Inventors: Pei-Heng Hung, New Taipei (TW); Hsiung-Shih Chang, Taichung (TW); Manoj Kumar, Dhanbad (IN); Yen-Ni Lee, Jhubei (TW); Teng-Shao Su, Tainan (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 15/006,667

(22) Filed: Jan. 26, 2016

(51) Int. Cl.
*H01L 29/06* (2006.01)
*H01L 23/528* (2006.01)
*H01L 23/522* (2006.01)
*H01L 29/861* (2006.01)

(52) U.S. Cl.
CPC ........ *H01L 23/528* (2013.01); *H01L 23/5226* (2013.01); *H01L 29/8611* (2013.01)

(58) Field of Classification Search
CPC . H01L 23/528; H01L 23/5226; H01L 29/8611
See application file for complete search history.

(56) References Cited

U.S. PATENT DOCUMENTS

| | | | |
|---|---|---|---|
| 4,032,955 A | 6/1977 | Anthony et al. | |
| 6,320,205 B1 | 11/2001 | Pfirsch et al. | |
| 8,278,728 B2 | 10/2012 | Murshid | |
| 2010/0019274 A1 | 1/2010 | Uno et al. | |
| 2012/0139079 A1* | 6/2012 | Tokura | H01L 21/76283 257/471 |
| 2016/0284793 A1* | 9/2016 | Yoo | H01L 29/0619 |

FOREIGN PATENT DOCUMENTS

| | | |
|---|---|---|
| JP | 2005-203738 A | 7/2005 |
| JP | 2006-24662 A | 1/2006 |
| TW | 201328428 A1 | 7/2013 |

OTHER PUBLICATIONS

Xiao, "Introduction to Semiconductor Manufacturing Technology, Second Edition," ISBN: 9780819490926, Nov. 19, 2012, 3 pages (with book description).

* cited by examiner

*Primary Examiner* — Long Pham
(74) *Attorney, Agent, or Firm* — Birch, Stewart, Kolasch & Birch, LLP

(57) ABSTRACT

A semiconductor device includes a plurality of first wires and second wires, a first conductive layer, and a second conductive layer. Each of the first wires forms a closed polygon and surrounds a center, and each of the second wires forms the closed polygon and surrounds the center. The first and second wires are interlaced, and none of the first and second wires are coupled to each other. The first conductive layer, having an entire surface structure, is disposed on the first and second wires and coupled to the first wires. The second conductive layer, having an entire surface structure, is disposed on the first and second wires and coupled to the second wires. The first conductive layer is disposed between the second conductive layer and the first and second wires, and the first and second conductive layers are not coupled to each other.

10 Claims, 7 Drawing Sheets

EFFICIENT LAYOUT PLACEMENT OF A DIODE

BACKGROUND OF THE INVENTION

Field of the Invention

The present application relates to a semiconductor device, and in particular to a layout placement of a diode.

Description of the Related Art

In recent years, the development of semiconductor devices continues the trend toward miniaturization, but some physical characteristics of the semiconductor devices may thus be adversely affected. For example, the diode's driving current is proportional to the junction perimeter. Therefore, how to increase the junction perimeter of a diode by efficiently enlarging the area thereof, such that the miniaturization of the device can be maintained and a greater driving current can also be obtained, is a problem that urgently needs to be solved.

BRIEF SUMMARY OF THE INVENTION

For solving the problem described above, the invention provides an efficient layout placement of a diode.

An embodiment of the invention provides a semiconductor device, including a plurality of first wires, a plurality of second wires, a first conductive layer, and a second conductive layer. Each of the first wires forms a closed polygon and surrounds a center, and each of the second wires forms the closed polygon and surrounds the center. The first and second wires are interlaced, and none of the first and second wires are coupled to each other. The first conductive layer, having an entire surface structure, is disposed on the first and second wires and coupled to the first wires. The second conductive layer, having an entire surface structure, is disposed on the first and second wires and coupled to the second wires. The first conductive layer is disposed between the second conductive layer and the first and second wires, and the first and second conductive layers are not coupled to each other.

In some embodiments, the first and second conductive layers are respectively a single entire copper foil.

In some embodiments, any of the first and second conductive layers covers all of the first and second wires.

In some embodiments, the semiconductor device further includes a plurality of first conductive vias and a plurality of second conductive vias. The first conductive vias are coupled to the first conductive layer and the first wires. The second conductive vias are coupled to the second conductive layer and the second wires.

In some embodiments, the first conductive layer has a plurality of through holes, and the second conductive vias pass through the through holes and couple the second conductive layer to the second wires.

In some embodiments, the second conductive vias and the first conductive layer are not coupled to each other.

In some embodiments, the through holes are arranged along the closed polygon and are spaced apart from each other.

In some embodiments, the closed polygon is a regular polygon, a circle, or an ellipse.

In some embodiments, the semiconductor device is a diode and further includes a plurality of P-type doping layers and a plurality of N-type doping layers. The first wires are coupled to the P-type doping layers, and the second wires are coupled to the N-type doping layers.

In some embodiments, each of the first wires is configured as an anode of the diode, and each of the second wires is configured as a cathode of the diode.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

Figure 1:
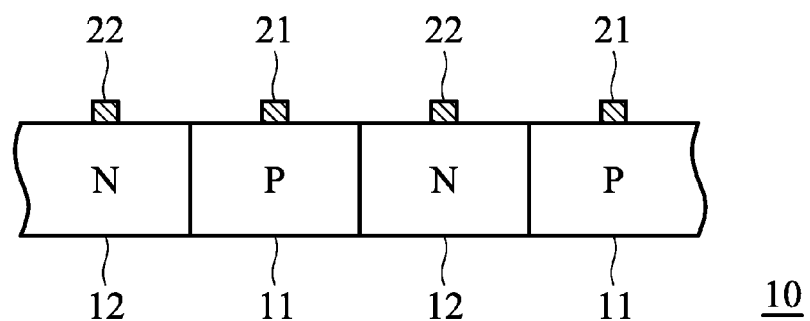
FIG. 1 is a partial cross-sectional view of a diode in accordance with an embodiment of the invention.

The following description is of the best-contemplated mode of carrying out the invention. This description is made for the purpose of illustrating the general principles of the invention and should not be taken in a limiting sense. The scope of the invention is best determined by reference to the appended claims.

The present disclosure may repeat reference numerals and/or letters in the various examples. This repetition is for the purpose of simplicity and clarity and does not in itself dictate a relationship between the various embodiments and/or configurations discussed. Various features may be arbitrarily drawn in different scales for the sake of simplicity and clarity. Furthermore, some elements not shown in the drawings or described in the embodiments have forms known by persons skilled in the field of the invention.

Figure 2:
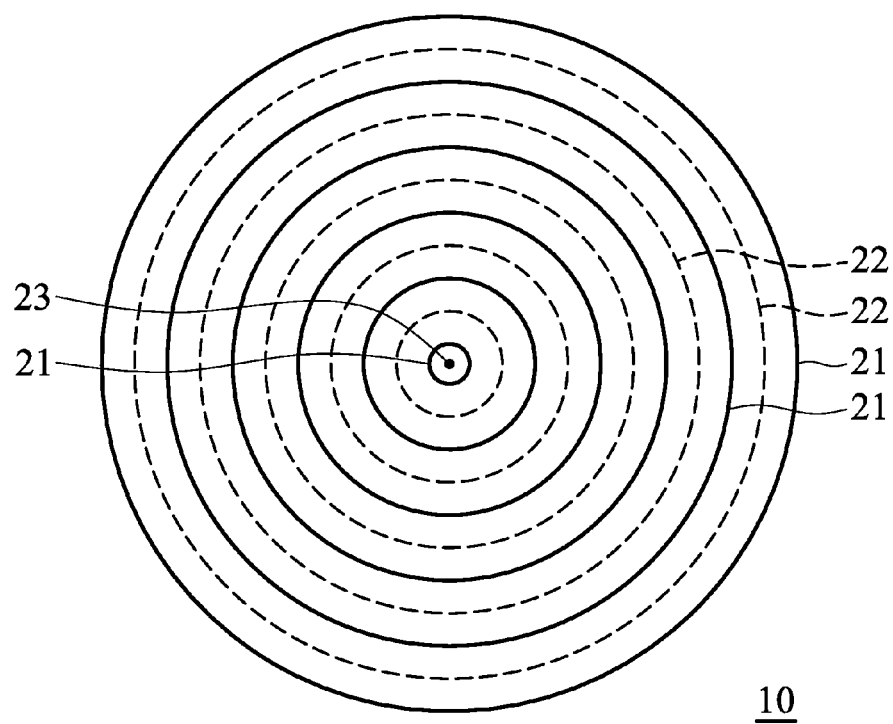
FIG. 2 is a top view of a diode in accordance with an embodiment of the invention.

FIG. 1 is a partial cross-sectional view of a diode in accordance with an embodiment of the invention. FIG. 2 is a top view of a diode in accordance with an embodiment of the invention. As shown in FIG. 1 and FIG. 2, the diode 10, for example, is a Schottky diode or a fast recovery diode, but the invention is not limited thereto. The diode 10 includes a plurality of P-type doping layers 11, a plurality of N-type doping layers 12, a plurality of first wires 21, and a plurality of second wires 22. The first wires 21 are disposed on and coupled to the P-type doping layers 11, and the second wires 22 are disposed on and coupled to the N-type doping layers 12. In some embodiments, the first wires 21 may also be disposed on and coupled to the N-type doping layers 12, and the second wires 22 may also be disposed on and coupled to the P-type doping layers 11. It should be noted that the P-type doping layers 11 and the N-type doping layers 12 under the first wires 21 and the second wires 22 are not shown in FIG. 2.

As shown in FIG. 2, each of the first wires 21 and the second wires 22 forms a closed circle and surrounds a center 23. More specifically, the first wires 21 and second wires 22 form concentric circles and are interlaced, wherein none of the first wires 21 and the second wires 22 are coupled to each other. In this embodiment, each of the second wires 22 is inserted between two of the first wires 21, and the outermost circle of the first and second wires 21 and 22 is a first wire 21. According to another embodiment of the invention, the outermost circle of the first and second wires 21 and 22 is a second wire 22, and each of the first wires 21 is inserted between two of the second wires 22.

It should be realized that there is a pitch between any two of the first wires 21 and the second wires 22, and the minimum of the pitch is determined according to the design rule of the semiconductor manufacturing process. Moreover, as the first wires 21 are coupled to the P-type doping layers 11 and the second wires 22 are coupled to the N-type doping layers 12, the first and second wires 21 and 22 are respectively configured as the anodes and cathodes of the diode 10. Conversely, as the first wires 21 are coupled to the N-type doping layers 12 and the second wires 22 are coupled to the P-type doping layers 11, the first and second wires 21 and 22 are respectively configured as the cathodes and anodes of the diode 10. None of the first wires 21 and the second wires 22 are coupled to each other, thereby preventing the occurrence of a short circuit.

In this embodiment, the P-type doping layers 11 and the N-type doping layers 12 below the first and second wires 21 and 22 form interlaced concentric circles having multiple junctions. With this repeatedly stacked (from inside to outside) structure, the junction perimeter of the diode 10 can be effectively increased, so as to increase the driving current of the diode 10 without enlarging the area thereof (the area efficiency can be enhanced), thereby facilitating the miniaturization of the device. Also, compared with conventional diodes, the diode 10 of this embodiment can obtain the same driving current by a smaller effective area of the device, thereby greatly reducing the production cost thereof and improving the product competitiveness.

Figure 3:
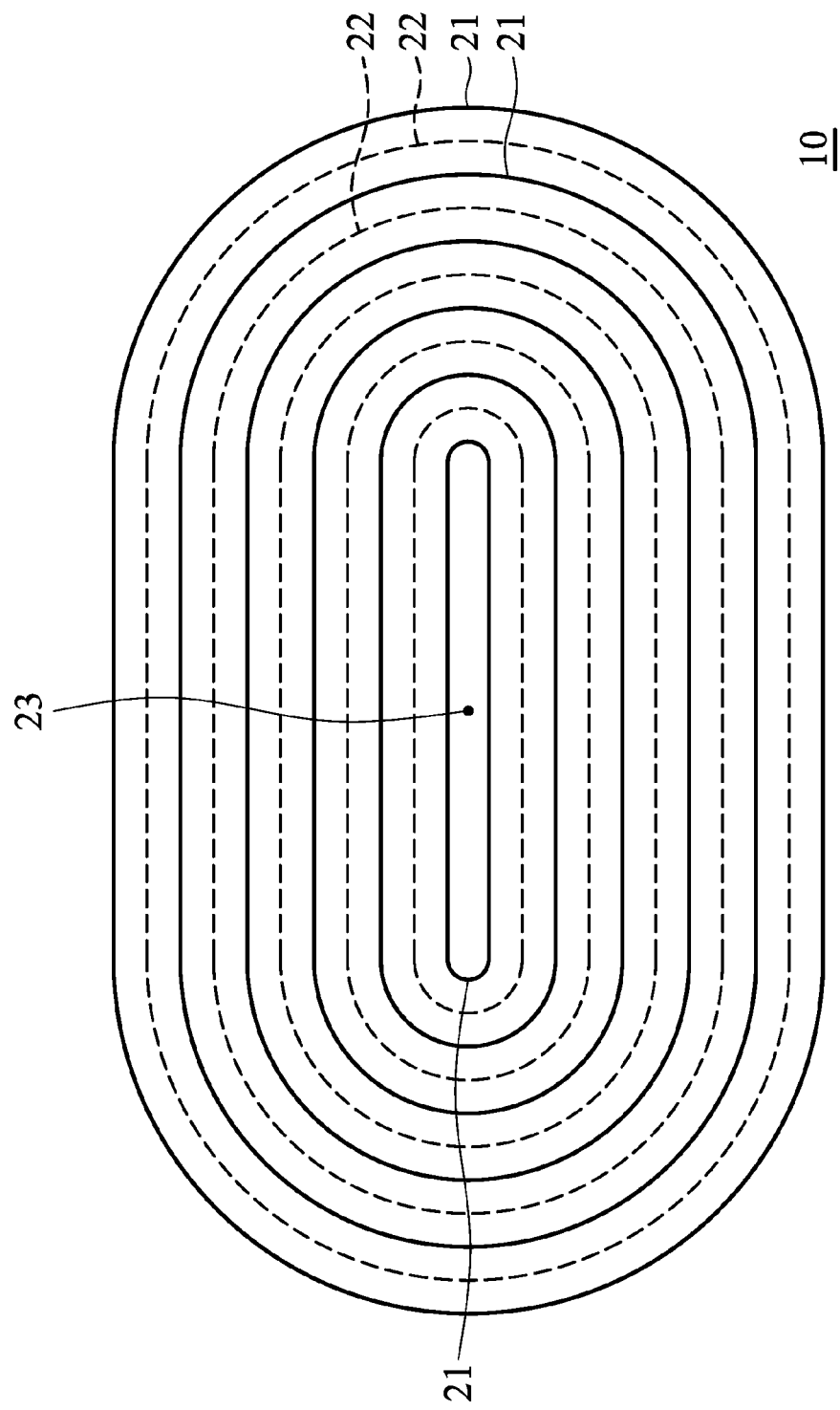
FIG. 3 is a top view of a diode in accordance with another embodiment of the invention.

FIG. 3 is a top view of a diode in accordance with another embodiment of the invention. In order to explain the technical features of this embodiment (FIG. 3) in detail, the following description will be accompanied with FIG. 1. As shown in FIG. 1 and FIG. 3, the diode 10, for example, is a Schottky diode or a fast recovery diode, but the invention is not limited thereto. The diode 10 includes a plurality of P-type doping layers 11, a plurality of N-type doping layers 12, a plurality of first wires 21, and a plurality of second wires 22. The first wires 21 are disposed on and coupled to the P-type doping layers 11, and the second wires 22 are disposed on and coupled to the N-type doping layers 12. In some embodiments, the first wires 21 may also be disposed on and coupled to the N-type doping layers 12, and the second wires 22 may also be disposed on and coupled to the P-type doping layers 11. It should be noted that the P-type doping layers 11 and the N-type doping layers 12 under the first wires 21 and the second wires 22 are not shown in FIG. 3.

As shown in FIG. 3, each of the first wires 21 and the second wires 22 forms a closed ellipse and surrounds a center 23. More specifically, the first wires 21 and second wires 22 form concentric ellipses and are interlaced, wherein none of the first wires 21 and the second wires 22 are coupled to each other. In this embodiment, each of the second wires 22 is inserted between two of the first wires 21, and the outermost circle of the first and second wires 21 and 22 is a first wire 21. According to another embodiment of the invention, the outermost circle of the first and second wires 21 and 22 is a second wire 22, and each of the first wires 21 is inserted between two of the second wires 22.

It should be realized that there is a pitch between any two of the first wires 21 and the second wires 22, and the minimum of the pitch is determined according to the design rule of the semiconductor manufacturing process. Moreover, as the first wires 21 are coupled to the P-type doping layers 11 and the second wires 22 are coupled to the N-type doping layers 12, the first and second wires 21 and 22 are respectively configured as the anodes and cathodes of the diode 10. Conversely, as the first wires 21 are coupled to the N-type doping layers 12 and the second wires 22 are coupled to the P-type doping layers 11, the first and second wires 21 and 22 are respectively configured as the cathodes and anodes of the diode 10. None of the first wires 21 and second wires 22 are coupled to each other, thereby preventing the occurrence of a short circuit.

In this embodiment, the P-type doping layers 11 and the N-type doping layers 12 below the first and second wires 21 and 22 form interlaced concentric ellipses having multiple junctions. With this repeatedly stacked (from inside to outside) structure, the junction perimeter of the diode 10 can be effectively increased, so as to increase the driving current of the diode 10 without enlarging the area thereof (the area efficiency can be enhanced), thereby facilitating the miniaturization of the device. Also, compared with conventional diodes, the diode 10 of this embodiment can obtain the same driving current by a smaller effective area of the device, thereby greatly reducing the production cost thereof and improving the product competitiveness.

Furthermore, the first and second wires 21 and 22 shown in FIG. 2 and FIG. 3 are in the metal-1 layer of a semiconductor manufacturing process, and the first wires 21 and second wires 22 are respectively coupled to the P-type doping layers 11 and the N-type doping layers 12 via contact points, but the invention is not limited thereto. In some embodiments, the first wires 21 and the second wires 22 may also be respectively coupled to the N-type doping layers 12 and the P-type doping layers 11 via contact points.

Although the first and second wires 21 and 22 each form a closed circle or ellipse in the aforementioned embodiments, they may also be a closed regular quadrangle, a closed regular hexagon, a closed regular octagon, or any other closed polygon. According to some embodiments, the closed polygon could be any other closed shape.

Figure 4:
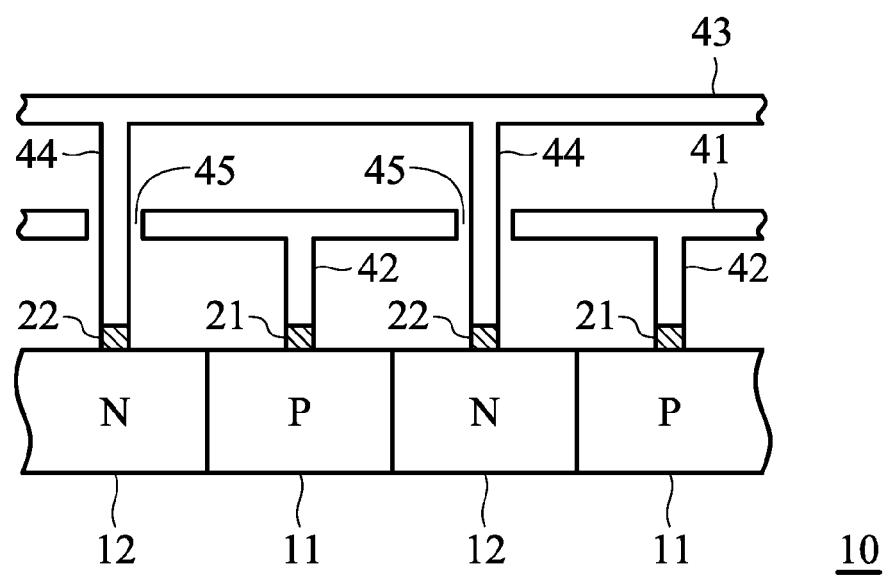
FIG. 4 is a partial cross-sectional view of a diode in accordance with another embodiment of the invention.

FIG. 4 is a partial cross-sectional view of a diode in accordance with another embodiment of the invention. In order to explain the technical features of this embodiment (FIG. 4) in detail, the following description will be accompanied with FIG. 2. As shown in FIG. 2 and FIG. 4, the diode 10, for example, is a Schottky diode or a fast recovery diode, but the invention is not limited thereto. The diode 10 includes a plurality of P-type doping layers 11, a plurality of N-type doping layers 12, a plurality of first wires 21, a plurality of second wires 22, a first conductive layer 41, a plurality of first conductive vias 42, a second conductive layer 43, and a plurality of second conductive vias 44. It should be realized that the layout placement of the P-type doping layers 11, the N-type doping layers 12, the first wires 21 and the second wires 22 in this embodiment (FIG. 4) refers to embodiment shown in FIG. 2 (arranged in interlaced concentric circles), and thus is not repeated here. In this embodiment, the first conductive layer 41 is disposed on the first and second wires 21 and 22 and coupled to the first wires 21 (and the P-type doping layers 11) via the first conductive vias 42, and the second conductive layer 43 is disposed on the first and second wires 21 and 22 and coupled to the second wires 22 (and the N-type doping layers 12) via the second conductive vias 44. Moreover, the first conductive layer 41 is disposed between the second conductive layer 43 and the first and second wires 21 and 22, and the first conductive layer 41 and the second conductive layer 43 are not coupled to each other.

Figure 5A:
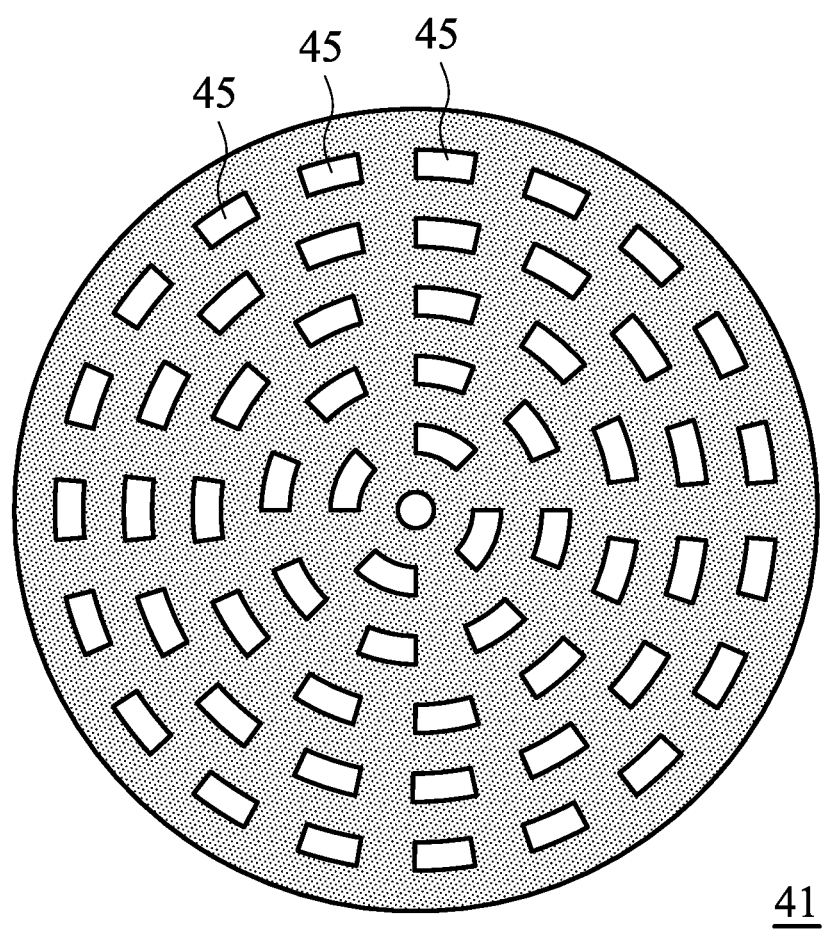
FIG. 5A is a top view of a first conductive layer in accordance with an embodiment of the invention.
Figure 5B:
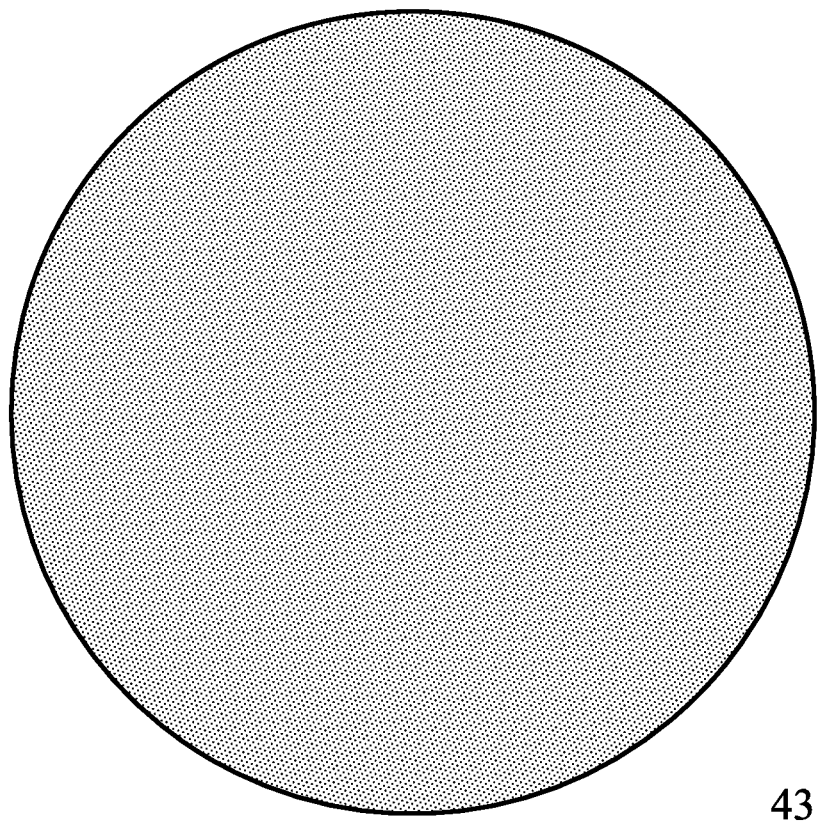
FIG. 5B is a top view of a second conductive layer in accordance with an embodiment of the invention.

It should be noted that the first conductive layer 41 and the second conductive layer 43 each have an entire surface structure (or a whole-area structure). FIG. 5A and FIG. 5B are top views of the first conductive layer 41 and the second conductive layer 43, respectively, in accordance with an embodiment of the invention. As shown in FIG. 5A and FIG. 5B, the first conductive layer 41 and the second conductive layer 43 each have a circular entire surface structure, and the first conductive layer 41 further has a plurality of through holes 45 which are arranged along the closed circle formed by the second wires 22 shown in FIG. 2 and are spaced apart from each other. Thus, the second conductive vias 44 shown in FIG. 4 can pass through the through holes 45 to couple the second conductive layer 43 to the second wires 22 (and the N-type doping layers 12). Furthermore, the first conductive layer 41 and the second conductive layer 43 have substantially the same area, and any of the first and second conductive layers 41 and 43 covers all of the first and second wires 21 and 22.

With the above design, a driving voltage can be uniformly applied between the P-type doping layers 11 and the N-type doping layers 12 via the first conductive layer 41 and the second conductive layer 43, resulting in the driving voltage provided between the P-type doping layers 11 and the N-type doping layers 12 at both the inner and outer sides of the diode 10 be consistent. Accordingly, the driving current produced from the junctions between the P-type doping layers 11 and the N-type doping layers 12 of the diode 10 can be ideally added to increase the entire driving current of the diode 10.

On the contrary, if the first and second conductive layers 41 and 43 having the entire surface structure are replaced by the narrow wires of prior art with high resistance, the driving voltage provided between the P-type doping layers 11 and the N-type doping layers 12 at the inner and outer sides of the diode 10 may be inconsistent (for example, the driving voltage at the outer side may be greater than the driving voltage at the inner side). Consequently, the driving current produced from the junctions between the P-type doping layers 11 and the N-type doping layers 12 of the diode 10 may also become inconsistent (and even some junctions will do not create driving current), such that the entire driving current of the diode 10 is reduced.

It should be noted that the first conductive layer 41 and the second conductive layer 43 of this embodiment are designed according to the number and area of the first and second wires 21 and 22, so as to cover all of the first and second wires 21 and 22. Therefore, when the number and area of the first and second wires 21 and 22 increase, the driving voltage provided between the P-type doping layers 11 and the N-type doping layers 12 at both the inner and outer sides of the diode 10 can still be consistent. Consequently, the driving current produced from the junctions between the P-type doping layers 11 and the N-type doping layers 12 of the diode 10 can still be ideally added to increase the entire driving current of the diode 10. Conversely, if the narrow wires of prior art are used, the entire driving current of the diode 10 may not be increased with the increase of the number and area of the first and second wires 21 and 22.

According to an embodiment of the invention, the hole walls of the through holes 45 shown in FIG. 4 may be coated with insulation materials, so as to avoid short circuit due to connection of the second conductive vias 44 and the first conductive layer 41. Moreover, some dielectric layers (not shown in FIG. 4) may also be disposed between the first conductive layer 41 and the second conductive layer 43 and between the first conductive layer 41 and the P-type and N-type doping layers 11 and 12 for insulation.

Although the first conductive layer 41 and the second conductive layer 43 shown in FIG. 4 are respectively coupled to the P-type doping layers 11 and the N-type doping layers 12, they may also respectively be coupled to the N-type doping layers 12 and the P-type doping layers 11.

Figure 6A:
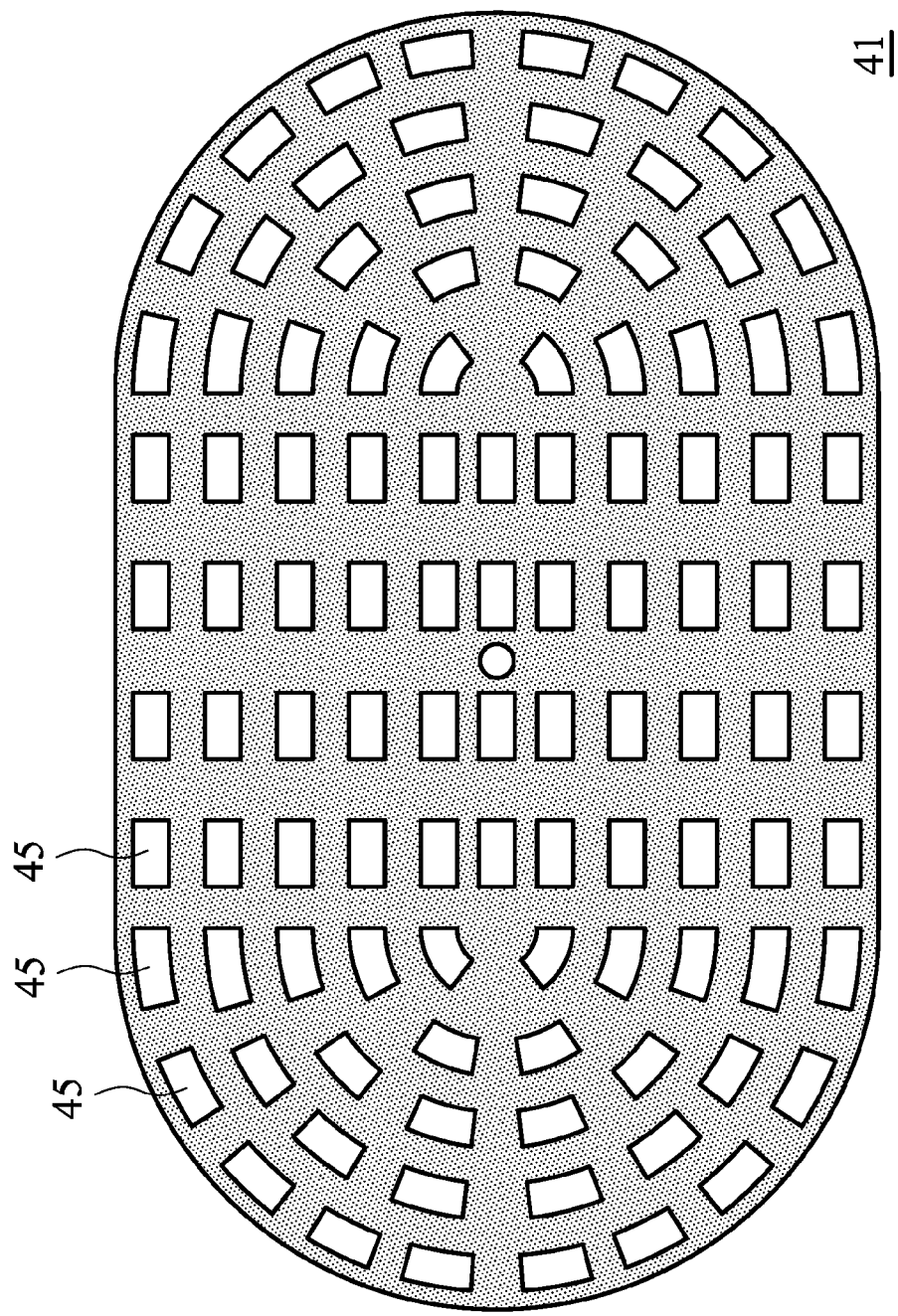
FIG. 6A is a top view of a first conductive layer in accordance with another embodiment of the invention.
Figure 6B:
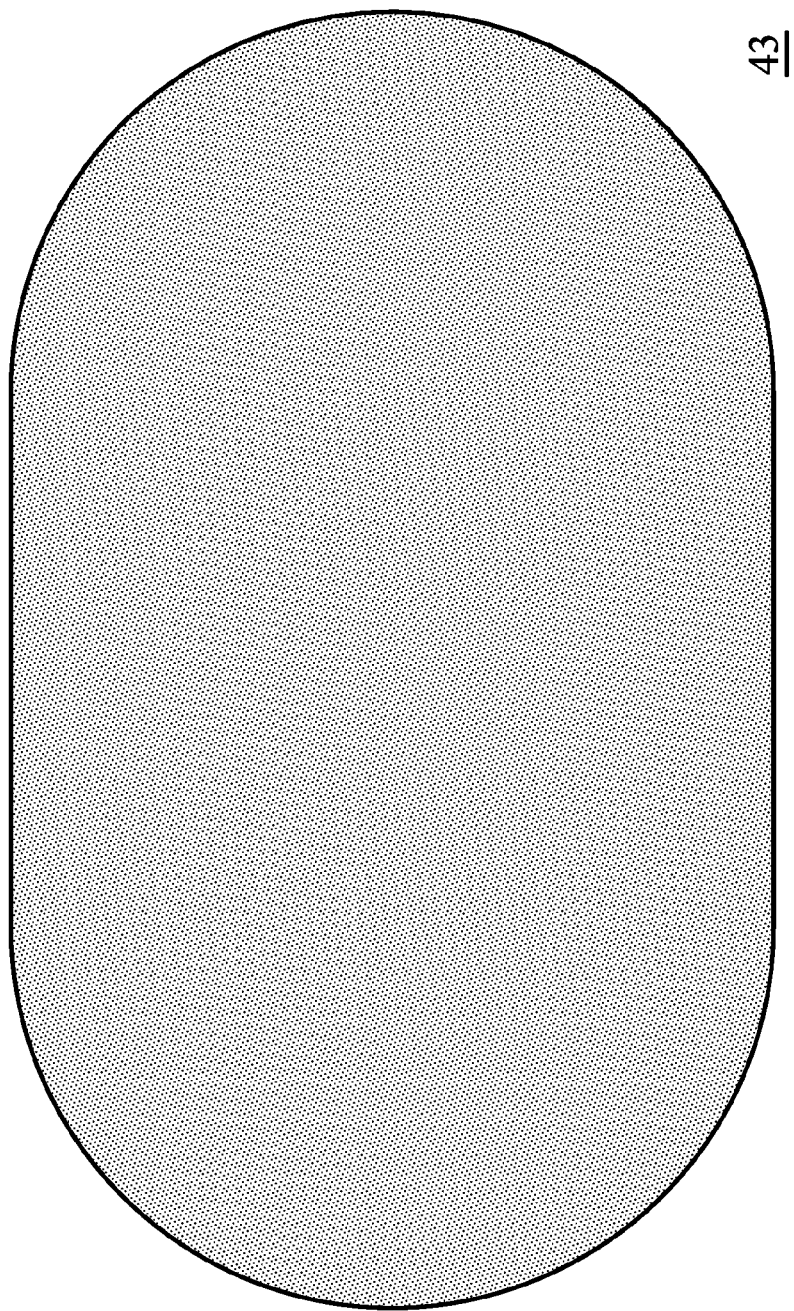
FIG. 6B is a top view of a second conductive layer in accordance with another embodiment of the invention.

According to another embodiment of the invention, each of the first and second wires 21 and 22 forms a closed ellipse (as shown in FIG. 3). In this case, the first conductive layer 41 and the second conductive layer 43 each have an elliptical entire surface structure (see FIG. 6A and FIG. 6B), and the first conductive layer 41 further has a plurality of through holes 45 which are arranged along the closed ellipse formed by the second wires 22 shown in FIG. 3 and are spaced apart from each other. Thus, the second conductive vias 44 shown in FIG. 4 can pass through the through holes 45 to couple the second conductive layer 43 to the second wires 22 (and the N-type doping layers 12). Similarly, the first conductive layer 41 and the second conductive layer 43 of this embodiment have substantially the same area, and any of the first and second conductive layers 41 and 43 covers all of the first and second wires 21 and 22. Therefore, the driving current produced from the junctions between the P-type doping layers 11 and the N-type doping layers 12 of the diode 10 can also be ideally added to increase the entire driving current of the diode 10.

According to some embodiments of the invention, if each of the first and second wires 21 and 22 is formed as a closed regular quadrangle, a closed regular hexagon, a closed regular octagon, or any other closed polygon, the shape of the first and second conductive layers 41 and 43 and the layout placement of the first conductive vias 42, the second conductive vias 44 and the through holes 45 can also be changed correspondingly.

In the embodiments described above, the first conductive layer 41 and the second conductive layer 43 each can be a single entire copper foil or other optional metal film.

According to some embodiments of the invention, the number of first conductive layers 41 or/and the number of second conductive layers 43 may also be plural, if the first conductive layers 41 and the second conductive layers 43 are arranged to be interlaced and are not coupled to each other.

It should be noted that, although the first conductive layer 41 and the second conductive layer 43 shown in FIG. 4 are respectively in the metal-2 layer and the metal-3 layer of a semiconductor manufacturing process, they may also be in any other different metal layers above the metal-1 layer (the first and second wires 21 and 22).

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
   a plurality of first wires, wherein each of the first wires forms a closed polygon and surrounds a center;
   a plurality of second wires, wherein each of the second wires forms the closed polygon and surrounds the center, and wherein the first and second wires are interlaced, and none of the first and second wires are coupled to each other;
   a first conductive layer, having an entire surface structure, disposed on the first and second wires and coupled to the first wires; and
   a second conductive layer, having an entire surface structure, disposed on the first and second wires and coupled to the second wires, wherein the first conductive layer is disposed between the second conductive layer and the first and second wires, and the first and second conductive layers are not coupled to each other.

2. The semiconductor device as claimed in claim 1, wherein the first and second conductive layers each are a single entire copper foil.

3. The semiconductor device as claimed in claim 1, wherein any of the first and second conductive layers covers all of the first and second wires.

4. The semiconductor device as claimed in claim 1, further comprising:
   a plurality of first conductive vias, coupled to the first conductive layer and the first wires; and
   a plurality of second conductive vias, coupled to the second conductive layer and the second wires.

5. The semiconductor device as claimed in claim 4, wherein the first conductive layer has a plurality of through holes, and the second conductive vias pass through the through holes and couple the second conductive layer to the second wires.

6. The semiconductor device as claimed in claim 5, wherein the second conductive vias and the first conductive layer are not coupled to each other.

7. The semiconductor device as claimed in claim 5, wherein the through holes are arranged along the closed polygon and are spaced apart from each other.

8. The semiconductor device as claimed in claim 1, wherein the closed polygon is a regular polygon, a circle, or an ellipse.

9. The semiconductor device as claimed in claim 1, wherein the semiconductor device is a diode which further comprises a plurality of P-type doping layers and a plurality of N-type doping layers, and wherein the first wires are coupled to the P-type doping layers, and the second wires are coupled to the N-type doping layers.

10. The semiconductor device as claimed in claim 9, wherein each of the first wires is configured as an anode of the diode, and each of the second wires is configured as a cathode of the diode.

* * * * *